(12) United States Patent
Hudson et al.

(10) Patent No.: US 7,851,368 B2
(45) Date of Patent: Dec. 14, 2010

(54) METHODS AND APPARATUS FOR IGNITING A LOW PRESSURE PLASMA

(75) Inventors: Eric Hudson, Berkeley, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 934 days.

(21) Appl. No.: 11/169,993

(22) Filed: Jun. 28, 2005

(65) Prior Publication Data

US 2008/0038925 A1 Feb. 14, 2008

(51) Int. Cl.
*H01L 21/302* (2006.01)
(52) U.S. Cl. .................. 438/714; 438/710; 156/345.45
(58) Field of Classification Search ................ 438/706, 438/710, 714, 712; 156/345.35, 36, 44, 45, 156/47, 48
See application file for complete search history.

(56) References Cited

U.S. PATENT DOCUMENTS

| | | |
|---|---|---|
| 5,449,432 A | 9/1995 | Hanawa |
| 6,634,313 B2 * | 10/2003 | Hanawa et al. ......... 118/723 IR |
| 2005/0205208 A1 * | 9/2005 | Sagae et al. ............ 156/345.28 |
| 2005/0264219 A1 * | 12/2005 | Dhindsa et al. ........ 315/111.21 |

OTHER PUBLICATIONS

Moravej et. al.,"Physics of high-pressure helium and argon radio-frequency plasmas," Journal of Applied Physics, vol. 96, No. 12, Dec. 2004, pp. 7011-7017.

(Continued)

*Primary Examiner*—Lan Vinh
(74) *Attorney, Agent, or Firm*—IP Strategy Group, P.C.

(57) ABSTRACT

In a plasma processing system having a plasma processing chamber, at least one powered electrode and an ignition electrode, a method for igniting a plasma is disclosed. The method includes introducing a substrate into the plasma processing chamber. The method also includes flowing a gas mixture into the plasma processing chamber; energizing the ignition electrode at a strike frequency; and striking a plasma from the gas mixture with the ignition electrode. The method further includes energizing the at least one powered electrode with a target frequency, wherein the strike frequency is greater than the target frequency; and de-energizing the ignition electrode while processing the substrate in the plasma processing chamber.

9 Claims, 10 Drawing Sheets

OTHER PUBLICATIONS

Lieberman et. al., "Standing Wave and Skin Effects in Large-Area, High Frequency Capacitive Discharges," Plasma Sources Science and Technology, vol. 11, Jun. 2002, pp. 283-293.

Lisovskiy et. al., "Rf Breakdown of Low-Pressure Gas and a Novel Method for Determination of Electron-drift Velocities in Gases," Department of Physics and Technology, Kharkov State University, vol. 31, Jun. 1998, pp. 3349-3357.

Maratkhanov, "On Evaluation of the Discharge Ignition Potential in the Transverse Magnetic Field," Plasma Physics Reports, vol. 21, No. 7, 1995, pp. 616-618.

"International Preliminary Report on Patentability", Issued in PCT Application No. PCT/US2006/023042; Mailing Date: Jun. 26, 2008.

Lisovskiy, et al, "Rf breakdown of low-pressure gas and a novel method for determination of electron-drift velocities in gases", J. Phys. D: Appl. Phys. 31, 1998, Jun. 3. 1998, pp. 3349-3357.

Moravej, et al "Physics of high-pressure helium and argon radio-frequency plasmas", Journal of Applied Physics, vol. 96, No. 12, Dec. 2004, pp. 7011-7017.

Lieberman, et al., "Standing wave and skin effects in large-area, high frequency capacitive discharges", Plasma Sources Science and Technology, vol. 11, Jun. 2002, pp. 283-293.

Maratkhanov, "On Evaluation of the Discharge Ignition Potential in the Transverse Magnetic Field", Plasma Physics Reports, vol. 21. Number 7, 1995, pp. 616-618.

"Chinese Office Action", U.S. Appl. No. 200680023828.2, Date Mailed Jul. 10, 2009.

* cited by examiner

METHODS AND APPARATUS FOR IGNITING A LOW PRESSURE PLASMA

BACKGROUND OF THE INVENTION

The present invention relates in general to substrate manufacturing technologies and in particular to methods and apparatus for igniting a low pressure plasma.

In the processing of a substrate, e.g., a semiconductor wafer, MEMS device, or a glass panel such as one used in flat panel display manufacturing, plasma is often employed. As part of the processing of a substrate (chemical vapor deposition, plasma enhanced chemical vapor deposition, physical vapor deposition, etch, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

As device dimensions shrink and more advanced materials are used, the requirements for substantially stable process conditions become even more stringent in order to maintain a uniform etch rate, reduce substrate contamination, etc. This is further aggravated by escalating requirements for high circuit density on substrates that may be difficult to satisfy using current plasma processing technologies where sub-micron via contacts and trenches has high aspect ratios.

In general, there are three types of etch processes: pure chemical etch, pure physical etch, and reactive ion etch. Pure chemical etching generally involves no physical bombardment, but rather a chemical interaction with materials on the substrate. Pure ion etching, often called sputtering, usually uses a plasma ionized inert gas, such as Argon, to dislodge material from the substrate. Etching that combines both chemical and ion processes is often called reactive ion etch (RIE), or ion assist etch.

In these and other types of plasma processes, it may be difficult to ignite a plasma in pressure ranges often required by many plasma processing recipes. In general, when RF power is applied to a set of electrodes, a varying electric field is established between them. If the RF power is sufficiently high, a free electron can be accelerated by the varying electric field until it gains enough energy to collide with an atom or molecule inside the chamber to generate an ion and another free electron. Because of the cascading of the ionization collisions, the entire plasma chamber soon fills with electrons and ions (e.g., plasma). In the plasma, some electrons are continually lost and consumed by collisions with the electrodes, the plasma chamber wall, and also by recombination collisions between electrons and ions and by attachment to neutral species. Hence, the ionization rate of a plasma chamber is mainly determined by the electron energy, which is in turn controlled by the applied power.

Depending on many additional factors including plasma gas chemistry, electrode materials, plasma chamber dimensions, method of RF delivery (e.g., inductively coupled, capacitively coupled, etc.), frequency of electrical excitation, etc., it may be difficult to ignite and sustain a plasma, if the gas pressure is relatively low (e.g., <100 mT in capacitive discharges, etc.). That is, below a critical strike pressure, the plasma may not be self-sustained ignited since the generation rate of electrons caused by ionization collisions may be below the loss rate of electrons. This may be true even in the situation where a previously established plasma can be transitioned to pressures below the critical strike pressure, without the plasma extinguishing.

One solution may be to sustain the plasma by temporarily increasing the gas pressure in order to also increase the plasma gas density and hence the number of collisions with atoms or molecules. That is, increase the generation rate of electrons above the loss rate of electrons. Once the plasma is ignited and stabilized at the higher pressure, the plasma chamber is transitioned to a lower target pressure in order to process the substrate. Target refers to acceptable value ranges in the plasma processing recipe (e.g., target pressure, target power, target gas flow, etc.) However, exposing the substrate to a higher pressure plasma (a non-steady state condition), even if momentarily, may introduce undesirable results on a particular substrate, or unacceptable quality fluctuations between substrates.

Another solution may be to operate the plasma chamber at a higher frequency. In general, higher frequencies tend to more effectively produce the plasma density, due to the more efficient electron heating mechanisms, than when excited by a lower frequency signal at a similar power level. However, increasing the plasma processing frequency may also be problematic. For example, a higher frequency may cause poorer uniformity due to electromagnetic standing wave and skin effects (M. A. Lieberman et al, Standing wave and skin effects in large-area, high frequency capacitive discharges, *Plasma Sources Sci. Technol.* 11 (2002) 283-293). Other problems may include causing a shift in plasma chemistry and ion/radical ratio because of modified electron temperature, and in difficulty matching tool-to-tool performance due to increased sensitivity to stray capacitance and inductance in the RF delivery and ground return system.

Another solution may be to combine, higher pressure with a different gas flow ratio that is optimized for igniting the plasma, during a short strike step, after which the plasma chamber is transitioned to a lower operational target pressure and appropriate target gas flow ratio in order to process the substrate. However, as before, substantially deviating from the process recipe may introduce undesirable results on a particular substrate, or unacceptable quality fluctuations between substrates.

Yet another well-known method to reduce the critical strike pressure on a narrow gap capacitive discharge system is to increase the electrode gap. In general, mean free path is defined as the average distance a particle can travel before it collides with another particle. Subsequently, increasing the electrode gap may also increases the mean free path, stabilizing a low pressure plasma (e.g., <100 mT, etc.) by increasing the ionization rate of a plasma chamber. However, increasing the gap size may also be problematic. For example, a larger gap may reduce etch rates due to lower power density, increase chamber condition memory effects due to longer gas residence time, and decrease process uniformity when using zoned gas introduction.

For example, dielectric etch reactors often use the combination of capacitively coupled RF excitation sources and relatively narrow electrode to electrode gap spacings. The Lam Research Exelan™ family, for instance, typically uses 1.3 to 2.5 cm gaps compared to 20 to 30 cm substrate diameters. This combination capacitive coupling and narrow gap tends to result in fairly high critical strike pressures which often exceed the desired processing pressure.

Referring now to FIG. 1, a simplified diagram of an inductively coupled plasma processing system is shown. Generally, an appropriate set of gases at a particular pressure and mixed in a particular way may be flowed from gas distribution system 122 into plasma chamber 102 having plasma chamber walls 117. These plasma processing gases may be subsequently ionized at a particular set of RF power settings at or in a region near injector 109 to form a plasma 110 in order to process (e.g., etch or deposit) exposed areas of substrate 114, such as a semiconductor substrate or a glass pane, positioned with edge ring 115 on an electrostatic chuck 116.

A first RF generator 134 generates the plasma as well as controls the plasma density, while a second RF generator 138 generates bias RF, commonly used to control the DC bias and the ion bombardment energy. Further coupled to source RF generator 134 is matching network 136a, and to bias RF generator 138 is matching network 136b, that attempt to match the impedances of the RF power sources to that of plasma 110. Furthermore, vacuum system 113, including a valve 112 and a set of pumps 111, is commonly used to evacuate the ambient atmosphere from plasma chamber 102 in order to achieve the required pressure to sustain plasma 110 and/or to remove process byproducts.

Referring now to FIG. 2, a simplified diagram of a capacitively coupled plasma processing system is shown. Generally, capacitively coupled plasma processing systems may be configured with a single or with multiple separate RF power sources. Source RF, generated by source RF generator 234, is commonly used to generate the plasma as well as control the plasma density via capacitively coupling. Bias RF, generated by bias RF generator 238, is commonly used to control the DC bias and the ion bombardment energy. Further coupled to source RF generator 234 and bias RF generator 238 is matching network 236, which attempts to match the impedance of the RF power sources to that of plasma 220. Other forms of capacitive reactors have the RF power sources and match networks connected to the top electrode 204. In addition there are multi-anode systems such as a triode that also follow similar RF and electrode arrangements.

Generally, an appropriate set of gases at a particular pressure, and mixed in a particular way, is flowed through an inlet in a top electrode 204 from gas distribution system 222 into plasma chamber 202 having plasma chamber walls 217. These plasma processing gases may be subsequently ionized at a particular set of RF power settings to form a plasma 220, in order to process (e.g., etch or deposit) exposed areas of substrate 214, such as a semiconductor substrate or a glass pane, positioned with edge ring 215 on an electrostatic chuck 216, which also serves as an electrode. Furthermore, vacuum system 213, including a valve 212 and a set of pumps 211, is commonly used to evacuate the ambient atmosphere from plasma chamber 202 in order to achieve the required pressure to sustain plasma 220.

In view of the foregoing, there are desired methods and apparatus for igniting a low pressure plasma.

SUMMARY OF THE INVENTION

The invention relates, in an embodiment, in a plasma processing system having a plasma processing chamber, at least one powered electrode and an ignition electrode, a method for igniting a plasma. The method includes introducing a substrate into the plasma processing chamber. The method also includes flowing a gas mixture into the plasma processing chamber; energizing the ignition electrode at a strike frequency; and striking a plasma from the gas mixture with the ignition electrode. The method further includes energizing the at least one powered electrode with a target frequency, wherein the strike frequency is greater than the target frequency; and de-energizing the ignition electrode while processing the substrate in the plasma processing chamber.

The invention relates, in another embodiment, to a plasma ignition apparatus configured to strike a plasma in a plasma processing chamber. The apparatus includes an ignition electrode configured to strike a plasma from a gas mixture at a strike frequency. The apparatus also includes at least one powered electrode configured to sustain the plasma at a target frequency, wherein the strike frequency is greater than the target frequency, a first surface area of the ignition electrode is substantially less than a second surface area of the at least one powered electrode, and the ignition electrode is de-energized while processing a substrate in the plasma processing chamber.

The invention relates, in another embodiment, in a plasma processing system having a plasma processing chamber, at least one powered electrode and an ignition electrode, an apparatus for igniting a plasma. The apparatus includes a means for introducing a substrate into the plasma processing chamber. The apparatus also includes a means for flowing a gas mixture into the plasma processing chamber; a means for energizing the ignition electrode at a strike frequency; and a means for striking a plasma from the gas mixture with the ignition electrode. The apparatus further includes a means for energizing the at least one powered electrode with a target frequency, wherein the strike frequency is greater than the target frequency; and a means for de-energizing the ignition electrode while processing the substrate in the plasma processing chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
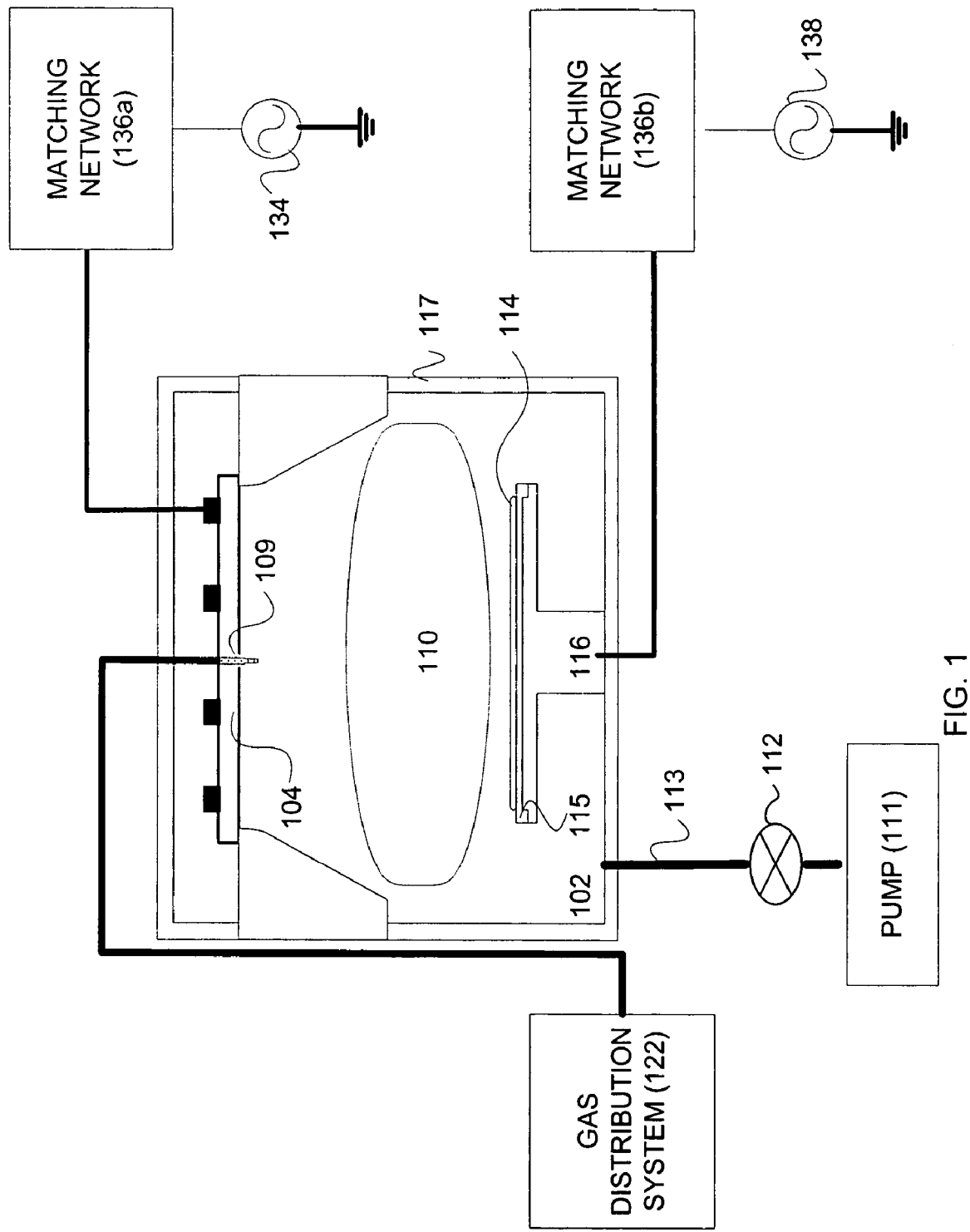
FIG. 1 illustrates a simplified diagram of an inductively coupled plasma processing system.
Figure 2:
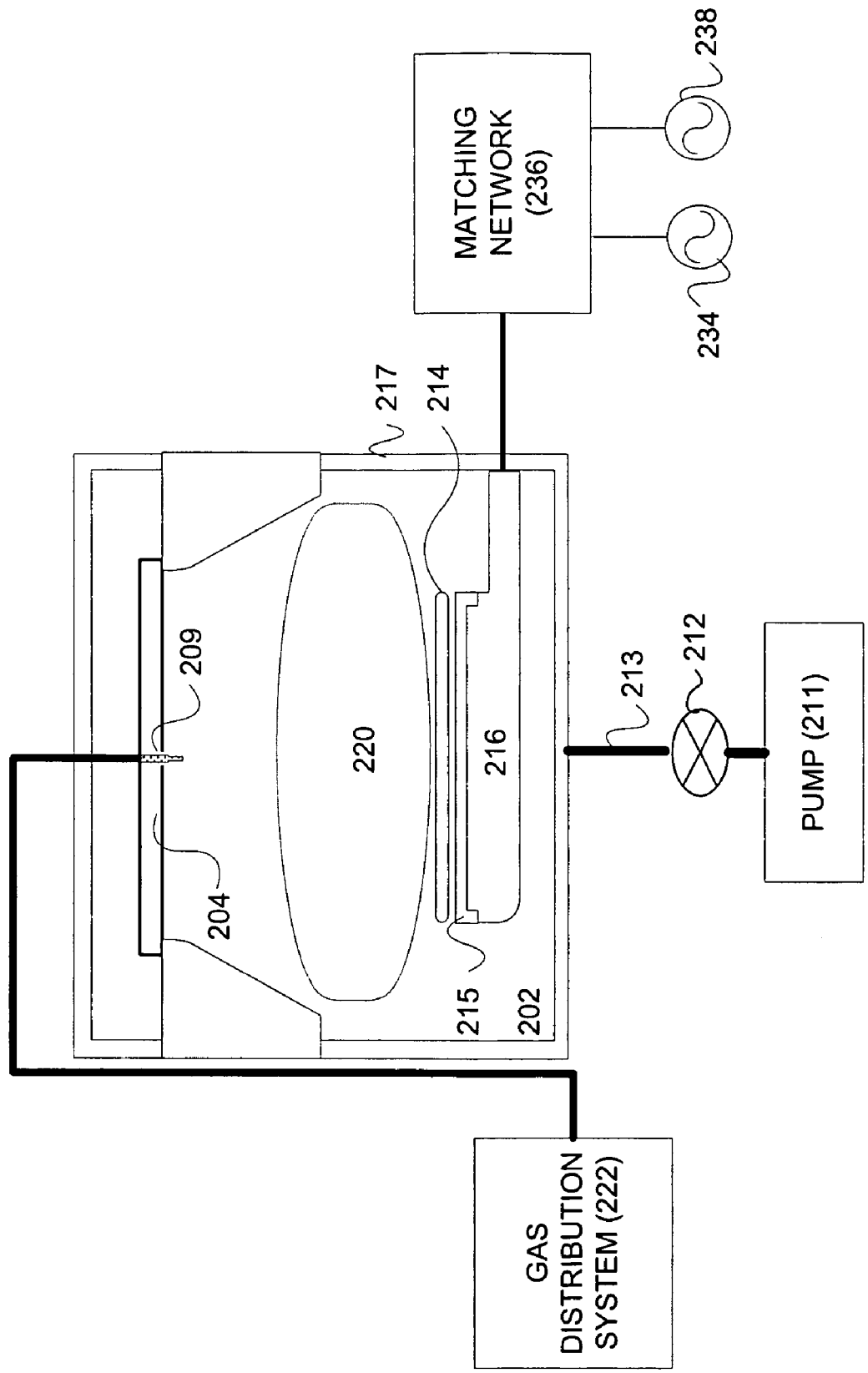
FIG. 2 illustrates a simplified diagram of a capacitively coupled plasma processing system.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that a low pressure plasma may be ignited by delivering an ignition RF voltage at a frequency (strike frequency) that may be higher than the set of operating frequencies (target frequencies) commonly used to sustain the low pressure plasma during processing. In an embodiment, the ignition RF voltage is delivered via at least one dedicated electrode (ignition electrode). In an embodiment, the ignition electrode is coupled to a strike RF generator. In an embodiment, an RF generator that is separate from the set of RF generators used to generate the target frequencies. In an embodiment, once the plasma has ignited, it is sustained by the plasma chamber electrodes at a set of target frequencies lower than or different from the strike frequency. In an embodiment, once the plasma has ignited, the ignition electrode is de-energized. In an embodiment, the plasma is ignited at the target pressure in order to minimize stabilization time. In an embodiment, the plasma is ignited with the target gas flow mixture in order to minimize stabilization time. In an embodiment, the plasma is ignited at the target power in order to minimize stabilization time.

Unlike the prior art, this invention does not necessitate increasing the electrode gap, as no gap change is generally required. In general, increasing the gap between the top and bottom electrode also increases the plasma volume which can in turn negatively impact the plasma processing results. For example, negative effects may include reduced etch rates due to lower power density, increased plasma chamber condition memory effects due to longer gas residence time, and less effective control over process uniformity when using zoned gas introduction.

In general, in a plasma processing chamber, a RF discharge may ignite a plasma when electrons in the gap between the electrodes gain the energy required for ionizing gas molecules. Subsequently, in order to ignite the discharge, every electron should perform 3-10 ionizing collisions with gas molecules before being lost to electrodes or chamber walls (V. A. Lisovsky and V. D. Yegorenkov, Rf breakdown of low-pressure gas and a novel method for determination of electron-drift velocities in gases, J. Phys. D: Appl. Phys. 31 (19998) 3349-3357). In RF discharges the electron oscillatory motion is generally characterized by the amplitude of electron displacement in the RF field. This amplitude may be inversely proportional to the discharge driving frequency and has to be comparable with or smaller than the electrode spacing for efficient RF breakdown. Therefore, for a given set of plasma chamber conditions (fixed gas pressure electrode spacing, electrode materials, RF voltage, etc.) a higher RF frequency is generally more efficient than a lower RF frequency for gas breakdown.

In an embodiment, an electrode with a smaller surface area than that of the top and bottom electrode may be used for the ignition electrode, in order to minimize harmful effects on the substrate, which may include perturbations to the initial part of the steady-state processing condition before the ignition voltage is removed. In embodiment, the ignition electrode may also include a plasma electrical probe.

For example, measurements on Lam Research Exelan™ using RF applied to the substrate electrode have shown a frequency dependence of the critical strike pressure. For $O_2$ ashing plasmas, the critical strike pressure is 55 mT at 28 MHz, but 3-5 mT at 63 MHz. For typical polymerizing via or trench conditions, the critical strike pressure is 23 mT at 28 MHz, but 10 mT at 63 MHz.

In an embodiment, ignition electrode may be independent of the main RF system of the plasma processing system, simplifying implementation. That is, integrating the ignition electrode in the bottom or top electrode may be problematic, since high power requirements and exacting reproducibility standards of the main RF system typically make integration expensive, complex. In addition, the presence of an integrated ignition electrode may adversely affect the plasma process which may be sensitive to small changes in stray impedance. Subsequently, an ignition subsystem added to this main RF system for ignition purposes could complicate the already substantially difficult and substantially expensive task of precisely controlling the RF with consistency over time and between plasma processing systems.

Figure 3A:
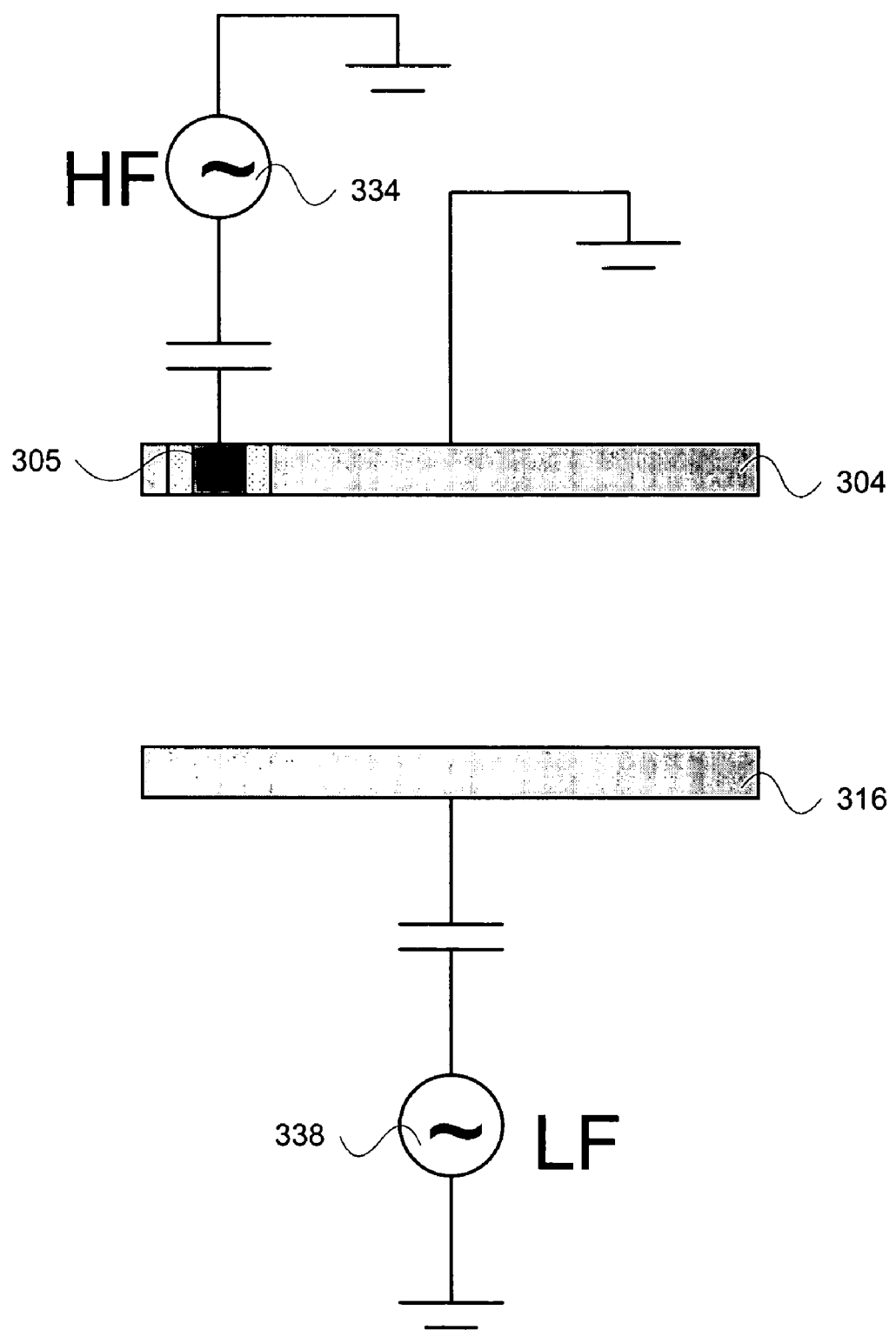
FIGS. 3A-C illustrate a simplified set of diagrams of a capacitively coupled plasma processing system with an ignition electrode, according to an embodiment of the invention.
Figure 3B:
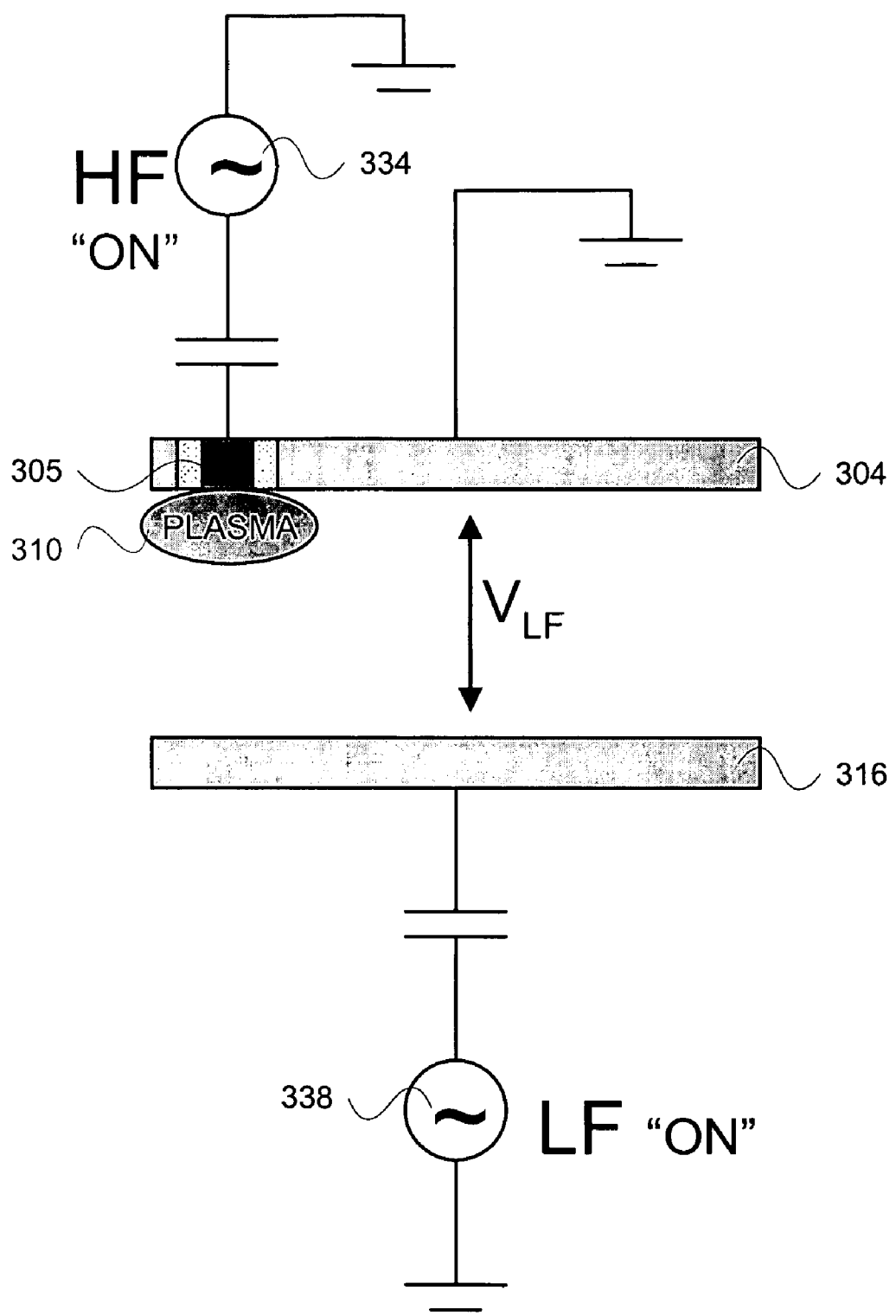
Figure 3C:
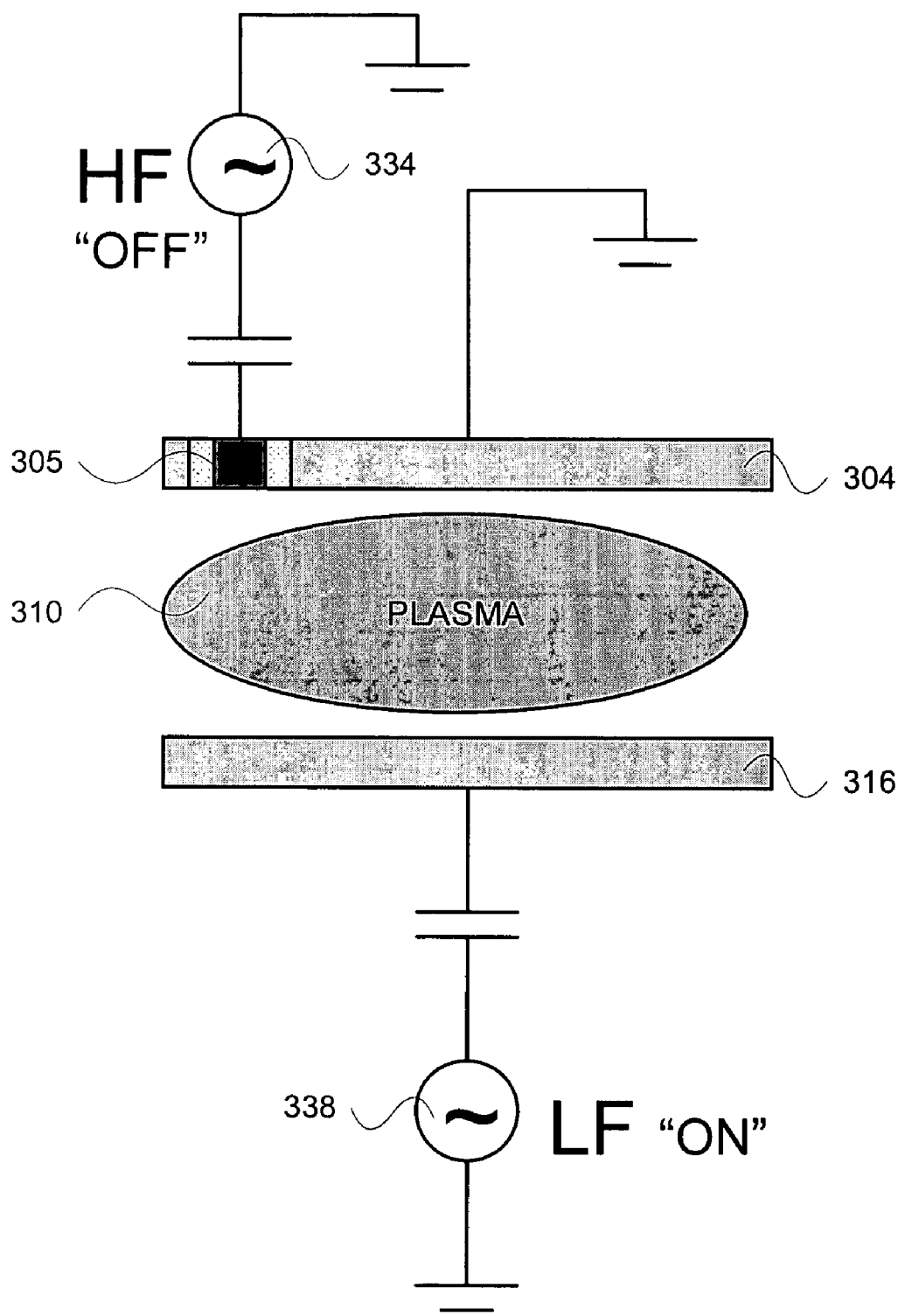

Referring to FIGS. 3A-C, a simplified set of diagrams illustrating a simplified capacitively coupled plasma processing system with an ignition electrode is shown, according to an embodiment of the invention. FIG. 3A illustrates the plasma chamber before the plasma has been ignited. Bottom electrode 316 is generally connected to a low frequency RF generator 338, while top electrode 304 is grounded. Additionally, an ignition electrode 305 is mounted in the top electrode 304, and may be powered by a high frequency RF generator 334.

FIG. 3B illustrates the plasma chamber of FIG. 3A in which ignition electrode has ignited a plasma. In an embodiment, as the plasma is ignited, low frequency RF generator 338 applies a voltage $V_{LF}$ between bottom electrode 316 and top electrode 304. FIG. 3C illustrates the plasma chamber of FIG. 3B in which ignition electrode 305 has been de-energized and plasma 310 is substantially stabilized in the plasma chamber.

In an embodiment, the ignition electrode may be combined with a V/I probe. Generally, a V/I can measure voltage (V), current (I), phase angle (θ) between the voltage (V) and current (I) of the plasma, impedance (Z), delivered power, forward power, reflected power, reactive power, reflection coefficient, etc. That is, once the plasma has been ignited, and the ignition electrode has been de-energized, it may still be used to measure plasma processing conditions.

Figure 4:
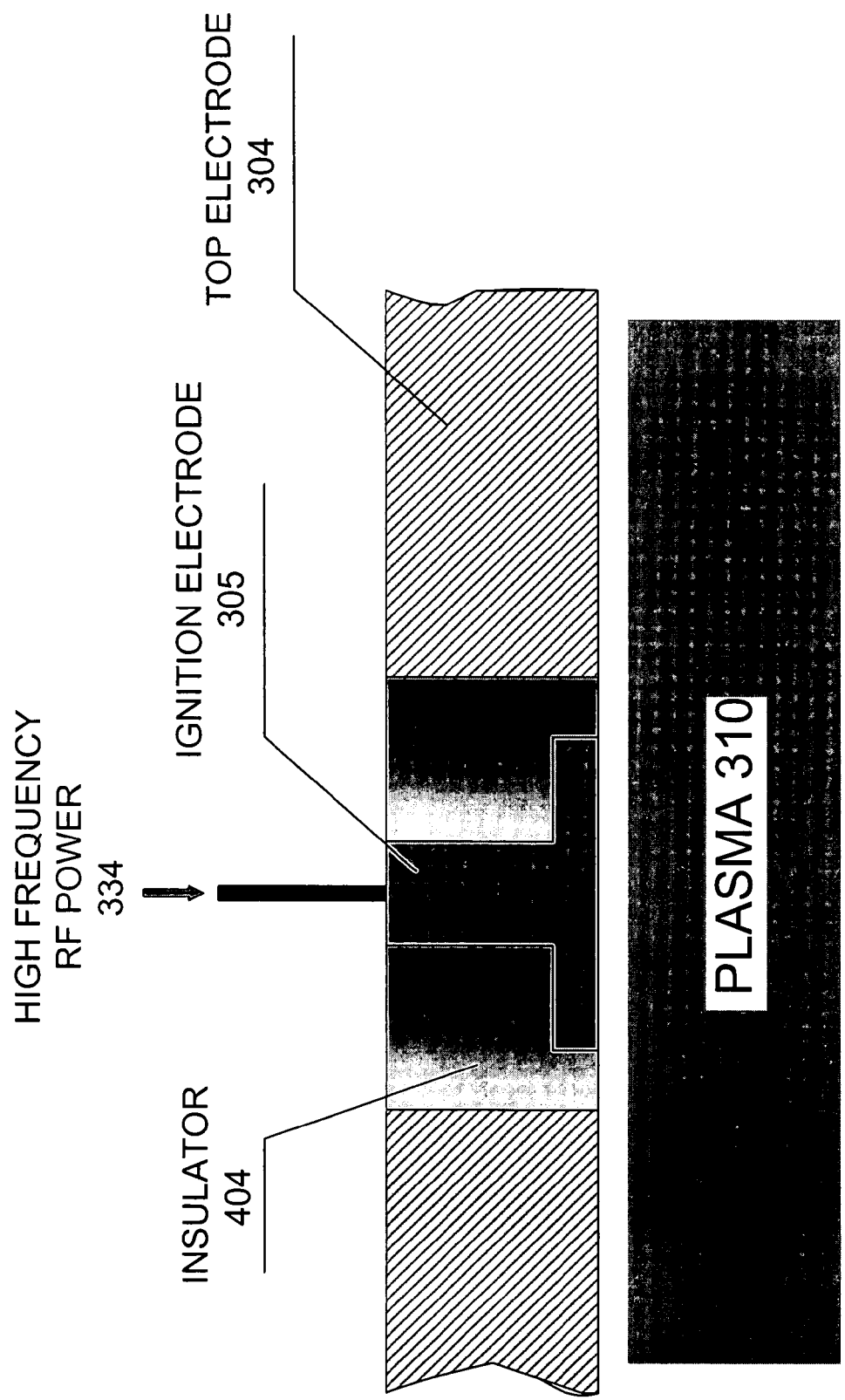
FIG. 4 shows a simplified diagram of ignition electrode, as shown in FIGS. 3A-C, according to an embodiment of the invention.

Referring to FIG. 4, a simplified diagram of ignition electrode 305, as shown in FIGS. 3A-C, is shown, according to an embodiment of the invention. As previously described, ignition electrode 305 may mounted in the top electrode 304, and may be powered by a high frequency RF generator 334. In addition, ignition electrode 305 may also be electrically isolated from top electrode 304 by an insulator 404 (e.g., ceramic, quartz, etc.).

Figure 5:
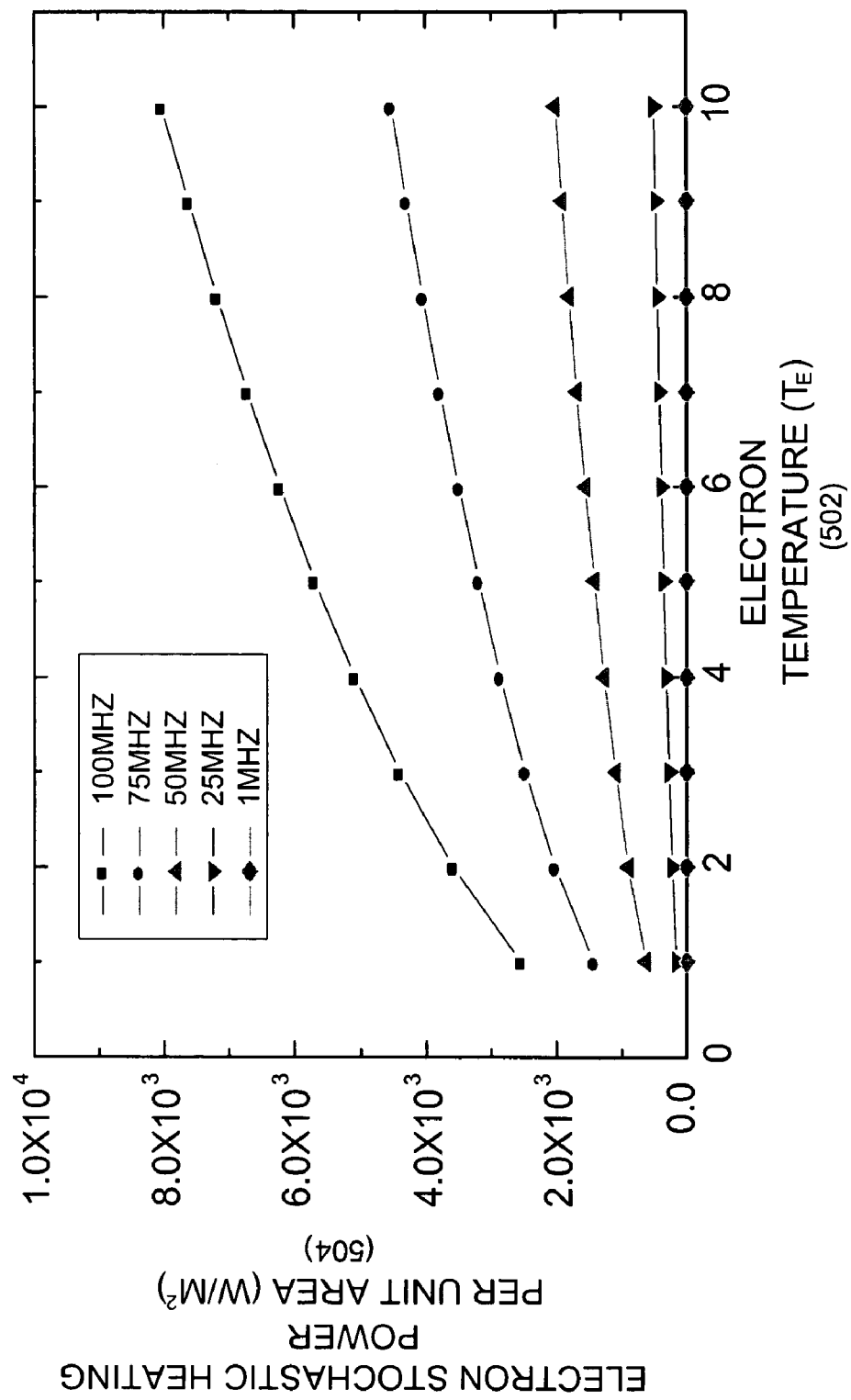
FIG. 5 shows a simplified diagram comparing electron temperature to electron stochastic heating power for various RF frequencies, according to an embodiment of the invention.

Referring now to FIG. 5, a simplified diagram comparing electron temperature to electron stochastic heating power for various RF frequencies, according to an embodiment of the invention. Electron temperature 502 is shown on the horizontal axis, while electron stochastic hearing power per unit area (W/M²) 504 is shown on the vertical axis. In general, in a RF discharge, most of the applied RF power is transferred to electrons via electron interactions with moving plasma sheaths (e.g., stochastic heating). The electron stochastic heating for a single collisional sheath may be found as:

$$\bar{S}_{stoc} \approx 0.61 \left(\frac{m}{e}\right)^{1/2} \varepsilon_0 \omega^2 T_e^{1/2} V_1 \quad \text{[EQUATION 1]}$$

where m is the mass of electron, e is an elementary charge, ∈0 is dielectric constant of vacuum, ω is rf driving frequency, Te is an electron temperature, and V1 is RF driving voltage across one sheath (Lieberman M. A. and Lichtenberg A. J. 1994 Principles of Plasma Discharges and Materials Processing, New York: Wiley). FIG. 5 generally shows dependence of electron stochastic heating on the driving frequency estimated using EQUATION 1 for fixed voltage V1=500 Volts. In general, since a higher frequency is more effective in electron heating process, a smaller voltage V1 may be required to strike and sustain the plasma. For example, at 100 MHz, as the electron temperature is increased form 1-10 $T_e$, the corresponding stochastic heating produced increases from about $2.5 \times 10^3$ W/M$^2$ to about $8 \times 10^3$ W/M$^2$. In contrast, a lower frequency is generally less effective in electron heating process. Hence, a larger voltage V1 may be required to strike and sustain the plasma. For example, at 1 MHz, as the electron temperature is increased form 1-10 $T_e$, the corresponding stochastic heating produced increase from about 0.0 W/M$^2$ to about $0.6 \times 10^3$ W/M$^2$.

Figure 6:
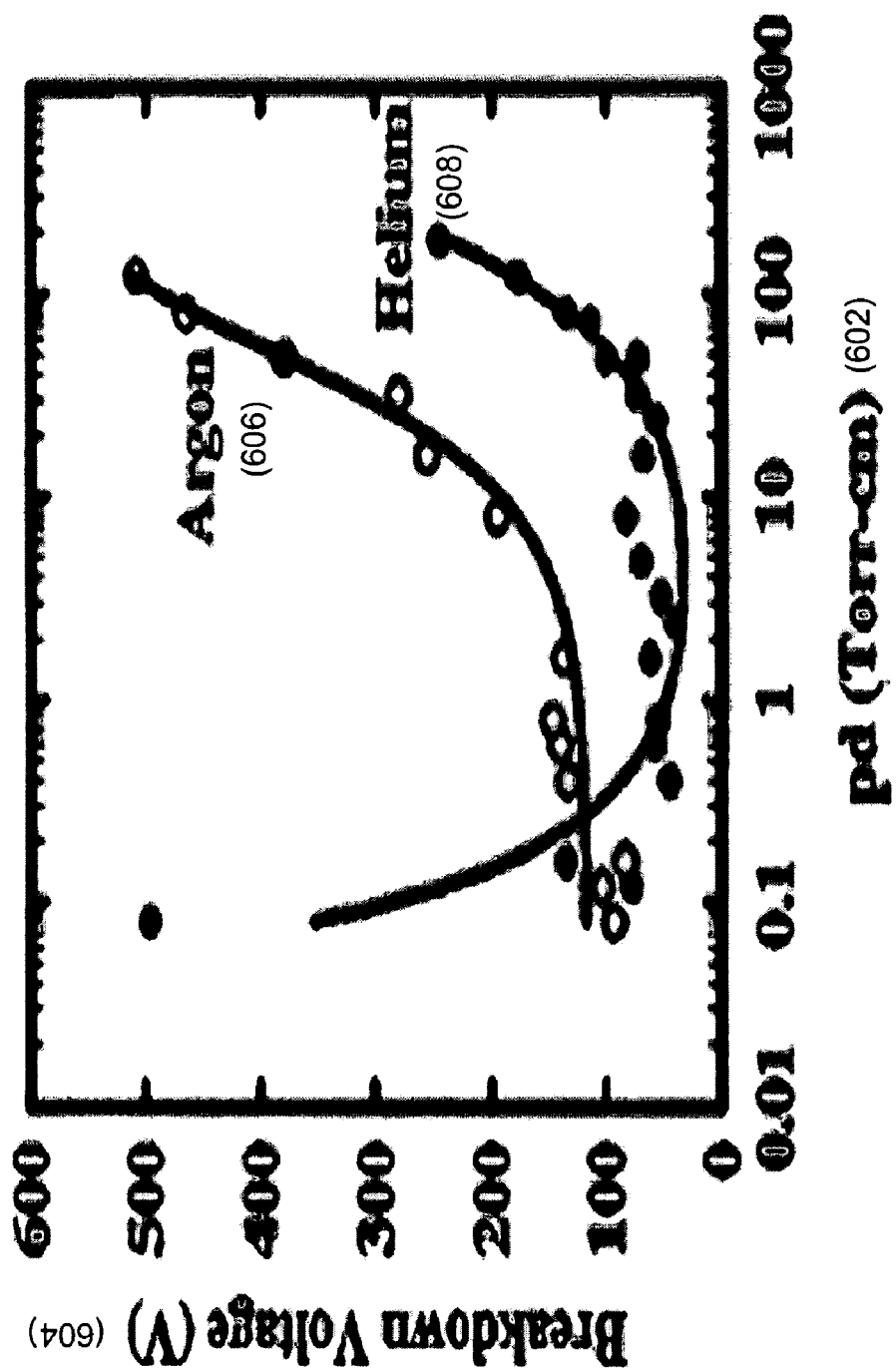
FIG. 6 shows a simplified diagram of a set of Paschen curves for breakdown of argon and helium discharges in RF plasmas, according to an embodiment of the invention.

Referring now to FIG. 6, a simplified diagram of a set of Paschen curves for breakdown of argon and helium discharges in RF plasmas is shown. Moravej et al., *Physics of high-pressure helium and argon radio-frequency plasmas*, Journal of Applied Physics, Volume 96, N 12, pp. 7011-7017. Product of neutral gas pressure and electrode gap, pd (Torrcm) 602, is shown on the horizontal axis, while breakdown voltage (V) 604 is shown on the vertical axis. In general, the voltage required to breakdown the discharge is a strong function of the product of the neutral gas pressure and electrode gap, pd.

Argon plasma curve 606 and helium plasma curve 608 were obtained by varying the pressure from 1 to 760 Torr and using three different gap spacings, 0.4, 1.6, and 2.4 mm. Helium plasma 606 generally exhibits a minimum breakdown voltage at a pd of about 4 Torr-cm, while the minimum value for argon was generally not ascertained. In comparison, in a plasma generated with dc discharge using an aluminum electrode, the minimum breakdown voltages for a helium plasma and an argon plasma are generally 1.3 Torr-cm and 0.3 Torr-cm, respectively. In general, higher voltages are required to breakdown the discharge at very low pressure with small electrode separation. In contrast, less voltage is generally necessary for plasma striking at higher frequencies.

Figure 7:
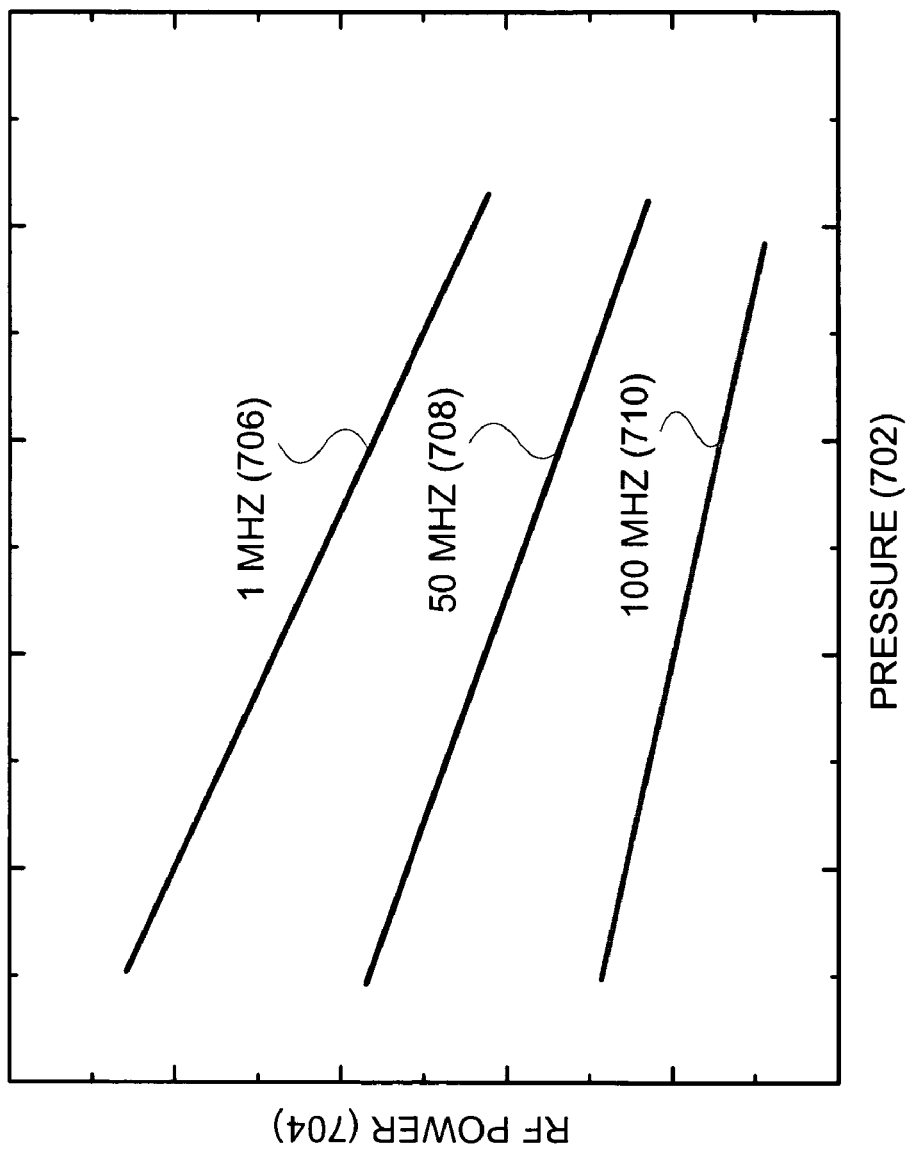
FIG. 7 shows a simplified diagram showing the dependence of the breakdown RF power on the pressure for fixed gap, according to an embodiment of the invention.

Referring now to FIG. 7, a simplified diagram showing the dependence of the breakdown RF power on the pressure for fixed gap, according to an embodiment of the invention. Pressure 702 is shown on the horizontal axis. RF power 704 is shown on the vertical axis. In addition, a set of RF-pressure profiles are shown for various frequencies: 1 MHz 706, 50 MHz 708, and 100 MHz 710. In general, for a given pressure, less power is needed for strike at higher frequency.

Figure 8:
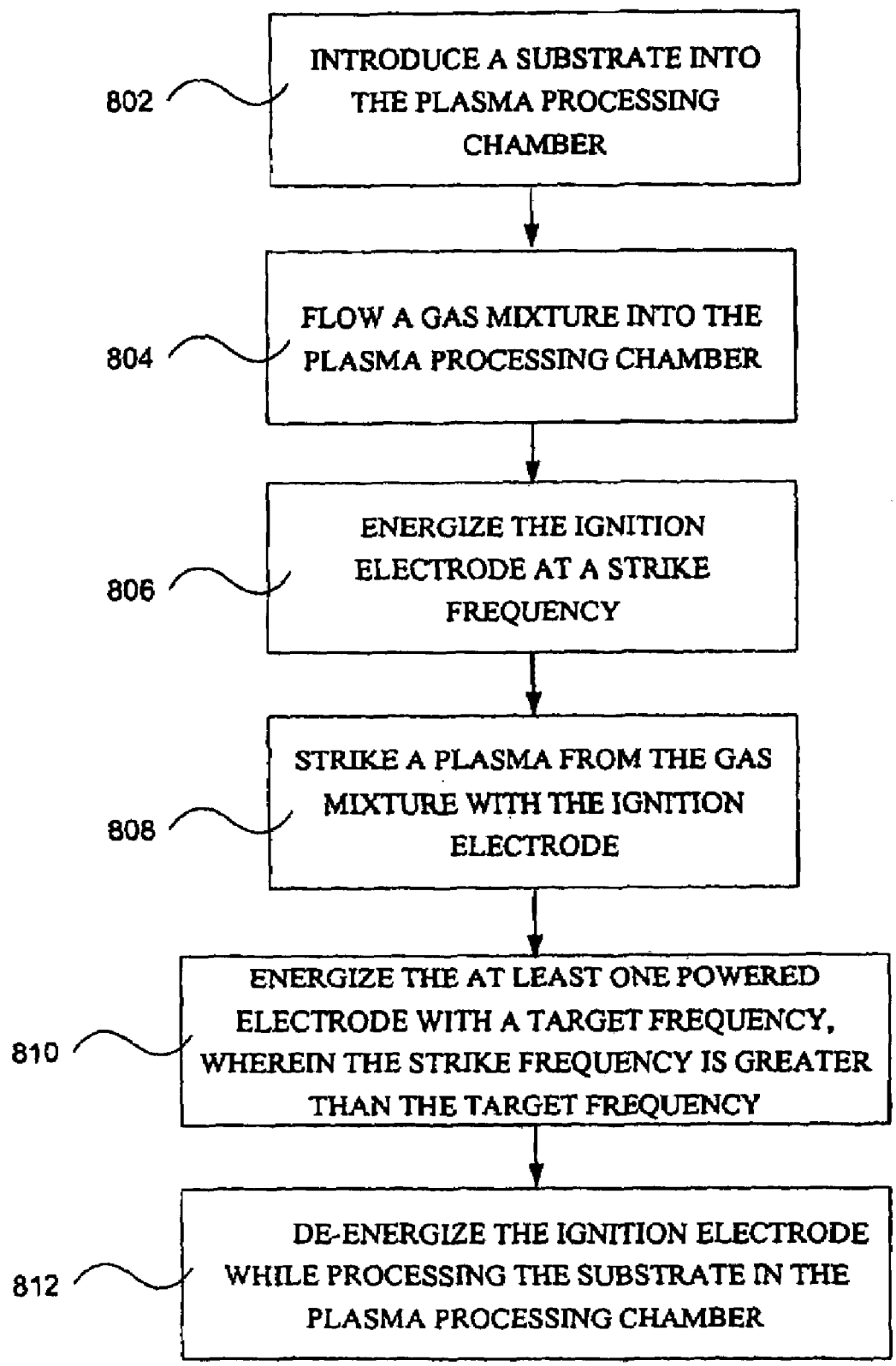
FIG. 8 illustrates a simplified set of steps for igniting a plasma, according to an embodiment of the invention.

Referring to FIG. 8, simplified set of steps for igniting a plasma, according to an embodiment of the invention. Initially, at step 802, a substrate is introduced into the plasma processing chamber. Next, at step 804 a gas mixture flowed into the plasma processing chamber. At step 806, the ignition electrode is energized at a strike frequency. At step 808, a plasma is struck from the gas mixture with the ignition electrode. At step 810, the at least one powered electrode is energized with a target frequency, wherein the strike frequency is greater than the target frequency. Finally, at step 812, the ignition electrode is de-energized while processing the substrate in the plasma processing chamber.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). Also, photoresist plasma etchants comprising gases other than oxygen may be used. In addition, the etching of other types of substrate materials may be optimized with the current invention. It should also be noted that there are many alternative ways of implementing the methods of the present invention. Furthermore, the term set as used herein includes one or more of the named element of the set. For example, a set of "X" refers to one or more "X."

Advantages of the invention include methods and apparatus for igniting a low pressure plasma. Additional advantages include the avoidance of cost, complexity, and quality problems related to an integrated ignition electrode, the minimization of manufacturing yield problems, and the optimization of plasma processing throughput.

Having disclosed exemplary embodiments and the best mode, modifications and variations may be made to the disclosed embodiments while remaining within the subject and spirit of the invention as defined by the following claims.

What is claimed is:

1. In a plasma processing system having a plasma processing chamber, a method for processing a substrate using a gas mixture, the method comprising:
   energizing an ignition electrode at a strike frequency;
   striking a plasma from said gas mixture with said ignition electrode;
   energizing at least one powered electrode with a target frequency to apply a voltage between a grounded electrode and said at least one powered electrode for sustaining said plasma, wherein said strike frequency is greater than said target frequency, said grounded electrode is different from said ignition electrode and different from said at least one powered electrode, and a strike pressure associated with said strike frequency is reduced if said strike frequency is increased; and
   de-energizing said ignition electrode while processing said substrate in said plasma processing chamber.

2. The method of claim 1 wherein said ignition electrode is mounted in said grounded electrode.

3. The method of claim 1 wherein said ignition electrode is electrically isolated from said grounded electrode by an insulator.

4. The method of claim 1 wherein said ignition electrode is independent of an RF system associated with said grounded electrode and said at least one powered electrode.

5. The method of claim 1 wherein said ignition electrode is includes a plasma electrical probe.

6. The method of claim 1 wherein said ignition electrode is combined with a Voltage/Current (V/I) probe.

7. The method of claim 1 wherein said gas mixture is flown into said plasma processing chamber at a pressure, said pressure is a target pressure for processing said substrate, and said plasma is ignited at said target pressure.

8. The method of claim 1 wherein a power of said at least one powered electrode is a target power for processing said substrate, said plasma ignited at said target power.

9. The method of claim 1 wherein said gas mixture is a target gas mixture for processing said substrate, said plasma ignited with said target gas mixture.

* * * * *